United States Patent
Kuo

(10) Patent No.: US 11,616,512 B1
(45) Date of Patent: Mar. 28, 2023

(54) SERIES-CONNECTED DELTA-SIGMA MODULATOR

(71) Applicant: National Cheng Kung University, Tainan (TW)

(72) Inventor: Tai-Haur Kuo, Tainan (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 17/672,728

(22) Filed: Feb. 16, 2022

(51) Int. Cl.
*H03M 3/00* (2006.01)
*H03F 3/217* (2006.01)

(52) U.S. Cl.
CPC .......... *H03M 3/368* (2013.01); *H03M 3/414* (2013.01); *H03M 3/438* (2013.01); *H03F 3/2175* (2013.01); *H03F 2200/03* (2013.01)

(58) Field of Classification Search
CPC ....... H03M 3/368; H03M 3/414; H03M 3/438
See application file for complete search history.

(56) References Cited

U.S. PATENT DOCUMENTS

| | | | | |
|---|---|---|---|---|
| 5,923,287 | A * | 7/1999 | Lennen | G01S 19/36 342/357.73 |
| 6,639,531 | B1 * | 10/2003 | Melanson | H03M 7/302 341/143 |
| 7,062,340 | B2 * | 6/2006 | Melanson | G10L 19/038 704/E19.017 |
| 7,266,152 | B2 * | 9/2007 | Noguchi | H03M 7/302 375/243 |
| 7,289,054 | B1 * | 10/2007 | Watanabe | H03M 3/35 341/143 |
| 8,421,660 | B1 * | 4/2013 | Wan | H03M 3/392 341/120 |
| 8,964,860 | B2 * | 2/2015 | Hori | H03F 3/24 341/172 |
| 9,641,190 | B1 * | 5/2017 | Braswell | H03M 3/422 |
| 9,859,916 | B1 * | 1/2018 | Verdant | H03M 3/50 |

(Continued)

OTHER PUBLICATIONS

Jia-Ming Liu, Shih-Hsiung Chien, and Tai-Haur Kuo, "Optimal Design for Delta-Sigma Modulators With Root Loci Inside Unit Circle," IEEE Trans. Circuits Syst. II, Exp. Briefs, vol. 59, No. 2, pp. 83-87, Feb. 2012.

(Continued)

*Primary Examiner* — Lam T Mai
(74) *Attorney, Agent, or Firm* — Winston Hsu

(57) ABSTRACT

A series-connected delta-sigma modulator (DSM) comprises a first DSM, configured to receive an input signal, comprising a first loop filter, configured to generate a first processed signal; and a first quantizer, coupled to the first loop filter, configured to generate a first quantized signal, and to feed back the first quantized signal to the first loop filter, wherein the first quantized signal comprises a clipping error smaller than a first predetermined value; and a second DSM, coupled to the first DSM, configured to receive the first quantized signal from the first DSM, comprising a second loop filter, configured to generate a second processed signal; and a second quantizer, coupled to the second loop filter, configured to generate a second quantized signal, and to feed back the second quantized signal to the second loop filter, wherein the second quantized signal comprises a quantization error smaller than a second predetermined value.

9 Claims, 9 Drawing Sheets

(56) References Cited

U.S. PATENT DOCUMENTS

| | | | |
|---|---|---|---|
| 10,177,776 B1* | 1/2019 | Ma | H03F 3/19 |
| 11,233,487 B1* | 1/2022 | Lesso | H03F 3/2175 |
| 2005/0242978 A1* | 11/2005 | Locher | H03M 3/33 |
| | | | 341/143 |
| 2008/0158031 A1* | 7/2008 | Kulinets | H03M 3/412 |
| | | | 341/161 |
| 2009/0128384 A1* | 5/2009 | Di Giandomenico | |
| | | | H03M 3/398 |
| | | | 341/143 |
| 2011/0037629 A1* | 2/2011 | Ceballos | H03M 3/412 |
| | | | 341/120 |
| 2012/0086589 A1* | 4/2012 | Haroun | H03M 3/344 |
| | | | 341/119 |
| 2013/0021104 A1* | 1/2013 | Schmidt | H03F 1/0288 |
| | | | 330/124 R |
| 2013/0076547 A1* | 3/2013 | Eldredge | H03M 7/3008 |
| | | | 341/143 |
| 2014/0240154 A1* | 8/2014 | Kim | H03M 7/3022 |
| | | | 341/143 |
| 2014/0313063 A1* | 10/2014 | Lindahl | H03M 3/436 |
| | | | 341/61 |
| 2015/0015426 A1* | 1/2015 | Lindahl | H03M 5/08 |
| | | | 341/53 |
| 2015/0145569 A1* | 5/2015 | Perrott | H03M 1/66 |
| | | | 327/156 |
| 2015/0180692 A1* | 6/2015 | Hezar | H04L 27/2602 |
| | | | 375/308 |
| 2015/0188740 A1* | 7/2015 | Kusunoki | H04L 7/0091 |
| | | | 341/143 |
| 2015/0281836 A1* | 10/2015 | Nguyen | H03M 3/356 |
| | | | 381/120 |
| 2016/0006452 A1* | 1/2016 | Saito | H03M 3/418 |
| | | | 324/426 |
| 2016/0173121 A1* | 6/2016 | Doare | H03M 3/378 |
| | | | 341/120 |
| 2017/0353191 A1* | 12/2017 | Weng | H03M 3/414 |
| 2019/0199368 A1* | 6/2019 | Weng | H03M 3/426 |
| 2020/0083900 A1* | 3/2020 | Shabra | H03M 3/42 |
| 2020/0119704 A1* | 4/2020 | Caduff | H03F 3/2173 |
| 2020/0304137 A1* | 9/2020 | Iwata | H03M 3/414 |
| 2021/0006908 A1* | 1/2021 | Straeussnigg | H04R 19/04 |

OTHER PUBLICATIONS

Shih-Hsiung Chien, Li-Te Wu, Ssu-Ying Chen, Ren-Dau Jan, Min-Yung Shih, Ching-Tzung Lin, and Tai-Haur Kuo, "An Open-Loop Class-D Audio Amplifier with Increased Low-Distortion Output Power and PVT-Insensitive EMI Reduction," in IEEE Custom Integrated Circuits Conference (CICC), Sep. 2014, pp. 1-4.

* cited by examiner

US 11,616,512 B1

SERIES-CONNECTED DELTA-SIGMA MODULATOR

BACKGROUND OF THE INVENTION

1. Field of the Invention

The present invention relates to a modulator, and more particularly, to a delta-sigma modulator (DSM) which is able to provide a high resolution, a high linearity, and to permit a large input range.

2. Description of the Prior Art

A DSM achieves a high signal-to-noise-and-distortion ratio (SNDR) and is often applied to high-resolution applications. However, when the input signal of the DSM is large, the output signal of the loop filter may include high-frequency-shaped noises, and may exceed the full scale of the quantizer, which leads to a significant clipping error. The clipping error is then fed back to the loop filter and processed by its high out-of-band gain, which induces an additional distortion source and degrades the corresponding SNDR severely. Thus, how to maintain the SNDR and the large input range of the DSM simultaneously is a problem to be solved.

SUMMARY OF THE INVENTION

The present invention therefore provides a series-connected DSM to solve the abovementioned problem.

A series-connected DSM comprises a first DSM, configured to receive an input signal, comprising a first loop filter, configured to generate a first processed signal; and a first quantizer, coupled to the first loop filter, configured to generate a first quantized signal according to the first processed signal, and to feed back the first quantized signal to the first loop filter, wherein the first loop filter generates the first processed signal according to the input signal and the first quantized signal fed back to the first loop filter, and the first quantized signal comprises a clipping error smaller than a first predetermined value; and a second DSM, coupled to the first DSM, configured to receive the first quantized signal from the first DSM, comprising a second loop filter, configured to generate a second processed signal; and a second quantizer, coupled to the second loop filter, configured to generate a second quantized signal according to the second processed signal, and to feed back the second quantized signal to the second loop filter, wherein the second loop filter generates the second processed signal according to the first quantized signal and the second quantized signal fed back to the second loop filter, and the second quantized signal comprises a quantization error smaller than a second predetermined value.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
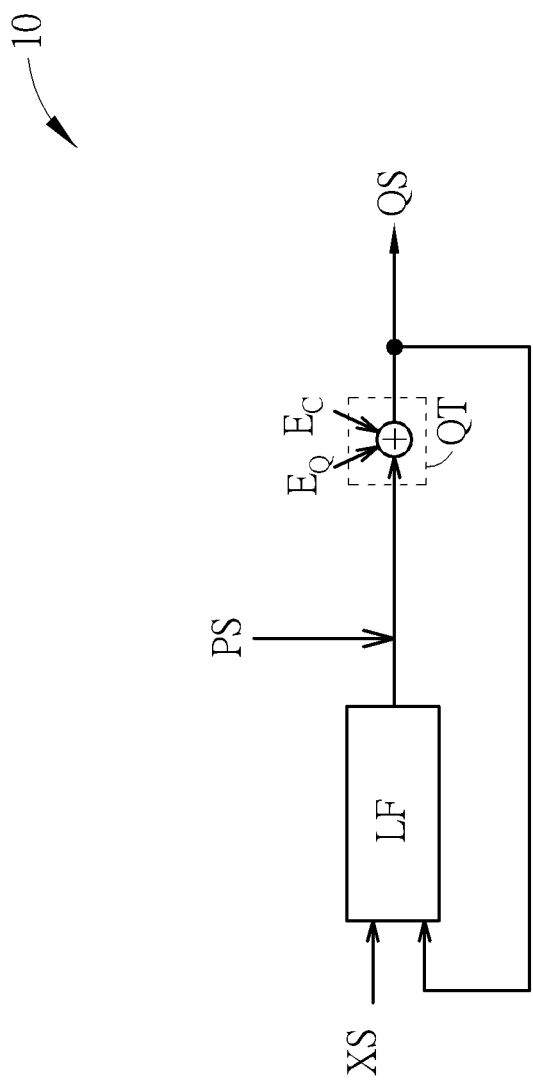
FIG. 1 is a schematic diagram of a delta-sigma modulator (DSM) according to the prior art.

FIG. 1 is a schematic diagram of a delta-sigma modulator (DSM) 10 according to the prior art. The DSM 10 is configured to receive an input signal XS, and includes a loop filter LF and a quantizer QT. The loop filter LF is configured to generate a processed signal PS. Then, the quantizer QT receives the processed signal PS and generates a quantized signal QS according to the processed signal PS. The quantized signal QS may be seen as an output signal of the DSM 10. The quantized signal QS is fed back to the loop filter LF. The loop filter LF generates the processed signal PS according to the input signal XS and the quantized signal QS. The quantizer QT may introduce a quantization error $E_Q$ and a clipping error $E_C$ in a quantization process. The quantization error $E_Q$ is shaped to a high-frequency band by a noise transfer function of the loop filter LF. To achieve a high signal-to-noise-and-distortion ratio (SNDR), the DSM 10 with more aggressive noise-shaping ability is utilized for suppressing the quantization error $E_Q$. However, a full scale of the quantizer QT may be exceeded by the output signal of loop filter (i.e., the processed signal PS) with high-frequency-shaped noises, which induces the clipping error $E_C$, when the input signal XS is large. The clipping error $E_C$ is then fed back to the loop filter LF, which induces an additional distortion source and severely degrades a corresponding SNDR of the DSM 10. On the other hand, the DSM 10 with less noise-shaping ability provides a larger input range at the expense of SNDR degradation.

The DSM 10 may be designed to extend the input range (e.g., by proposing a root-loci-inside-unit-circle (RLiUC) technique or an adaptive-coefficient DSM (ACDSM)). However, in-band noise-shaping abilities of both techniques are degraded, which leads to a degraded SNDR.

Figure 2:
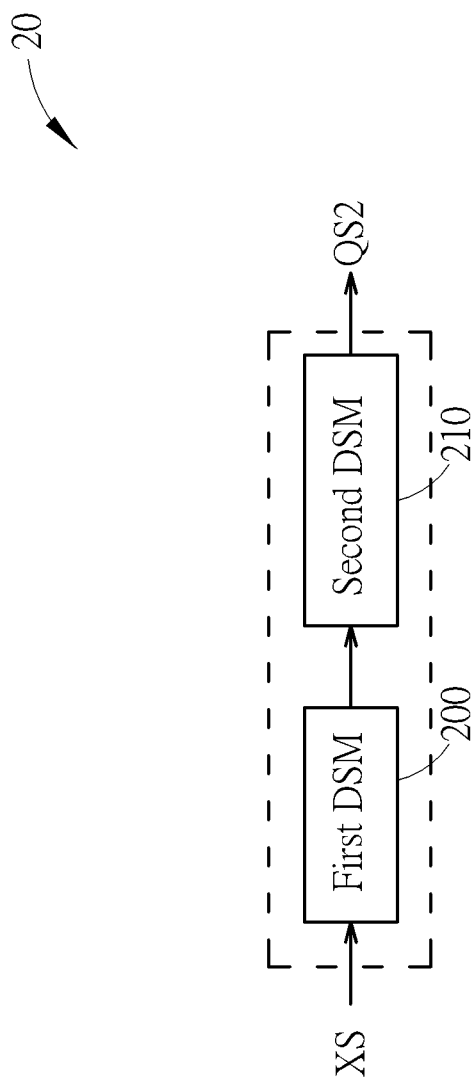
FIG. 2 is a schematic diagram of a series-connected DSM in general according to an example of the present invention.

FIG. 2 is a schematic diagram of a series-connected DSM 20 in general according to an example of the present invention. The series-connected DSM 20 includes a first DSM 200 and a second DSM 210. The first DSM 200 receives an input signal XS. The first DSM 200 may be a quantization-error-shaping DSM with aggressive noise-shaping ability to achieve a high SNDR of the series-connected DSM 20. The second DSM 210 transmits an output signal QS2. The second DSM 210 may be a clipping-error-shaping DSM to ensure a large input range of the series-connected DSM 20.

Figure 3:
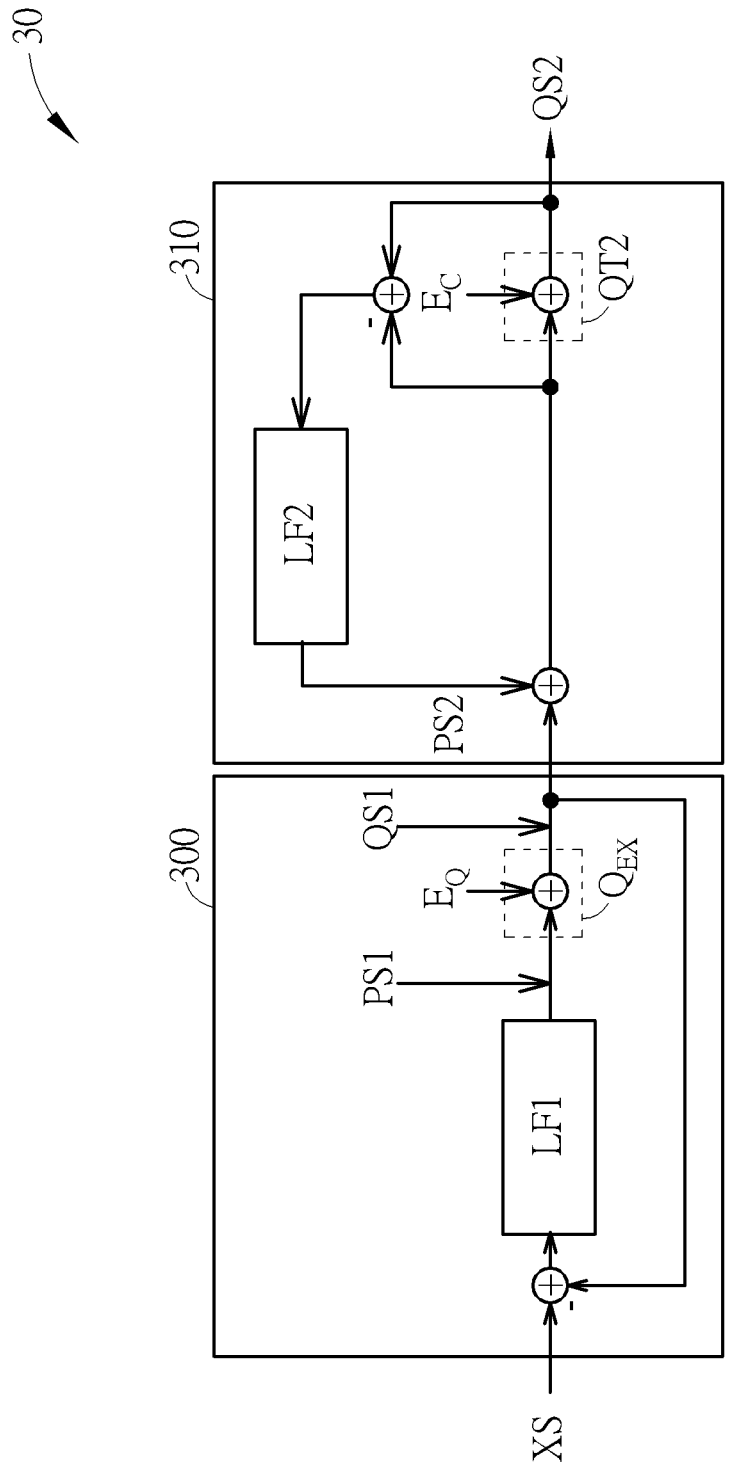
FIG. 3 is a schematic diagram of a series-connected DSM in detail according to an example of the present invention.

FIG. 3 is a schematic diagram of a series-connected DSM 30 in detail according to an example of the present invention. The series-connected DSM 30 includes a first DSM 300 and a second DSM 310. The first DSM 300 is configured to receive an input signal XS, and includes a first loop filter LF1 and a first quantizer $Q_{EX}$. The first loop filter LF1 is configured to generate a first processed signal PS1. The first quantizer $Q_{EX}$ is coupled to the first loop filter LF1, and is configured to generate a first quantized signal QS1 according to the first processed signal PS1. The first quantized signal QS1 may be seen as an output signal of the first DSM 300. Then, the first quantized signal QS1 is fed back to the first loop filter LF1 so that the first loop filter LF1 may generate the first processed signal PS1 according to the input signal XS and the first quantized signal QS1. The first quantized signal QS1 may include a clipping error $E_C$ smaller than a first predetermined value due to the extended full scale of the first quantizer $Q_{EX}$. That is, the first DSM 300 may mainly suppress the quantization error $E_Q$, forming a quantization-error-shaping DSM. Only little clipping error $E_C$ is processed by the first DSM 300 so that the SNDR of the first DSM 300 may be maintained at an appropriate level.

The second DSM 310 is coupled to the first DSM 300, and is configured to receive the first quantized signal QS1 (i.e., the output signal of the first DSM 300) from the first DSM 300. The second DSM 310 includes a second loop filter LF2 and a second quantizer QT2. The second loop filter LF2 is configured to generate a second processed signal PS2. The second quantizer QT2 is coupled to the second loop filter LF2, and is configured to generate a second quantized signal QS2 according to the second processed signal PS2. The second quantized signal QS2 may be seen as an output signal of the series-connected DSM 30. Then, the second quantized signal QS2 is fed back to the second loop filter LF2 so that the second loop filter LF2 may generate the second processed signal PS2 according to the first quantized signal QS1 (i.e., the input signal of the second DSM 310) and the second quantized signal QS2. The second quantized signal QS2 may include a quantization error $E_Q$ smaller than a second predetermined value. That is, the second DSM 310 may mainly suppress the clipping error $E_C$, forming a clipping-error-shaping DSM. Only little quantization error $E_Q$ is processed by the second DSM 310 so that the input range is extended. It should be noted that only little quantization error is allowed to be introduced in the second DSM 310 to maintain a high SNDR.

In one example, the first loop filter LF1 includes at least one first stage for receiving the input signal XS and the first quantized signal QS1. The second loop filter LF2 includes at least one second stage for receiving the first quantized signal QS1 (i.e., the input signal of the second DSM 310) and the second quantized signal QS2.

In one example, the first loop filter LF1 and the second loop filter LF2 may include (e.g., may be realized as) at least one integrator or at least one resonator. In one example, the first loop filter LF1 and the second loop filter LF2 may include (e.g., may be realized in) at least one discrete-time circuit or at least one continuous-time circuit.

In one example, the first quantizer $Q_{EX}$ includes a first plurality of quantization levels, and the second quantizer QT2 includes a second plurality of quantization levels. A number of the first plurality of quantization levels is larger than a number of the second plurality of quantization levels. That is, the second quantizer QT2 may be a conventional quantizer (e.g., the quantizer QT of the DSM 10), and the first quantizer $Q_{EX}$ may be an extended quantizer with more quantization levels than the conventional quantizer (e.g., the second quantizer QT2). The additional quantization levels included in the first quantizer $Q_{EX}$ are beyond an original full scale to provide extra quantization levels. In this situation, most of the clipping error $E_C$ of the first quantizer $Q_{EX}$ is temporarily avoided even if an input of the first quantizer $Q_{EX}$ is large, which makes little clipping error $E_C$ processed by the first loop filter LF1.

In one example, the first quantizer $Q_{EX}$ and the second quantizer QT2 perform a plurality of sampling operations at a same frequency. In one example, the first quantizer $Q_{EX}$ and the second quantizer QT2 perform a plurality of sampling operations at different frequencies.

Figure 4:
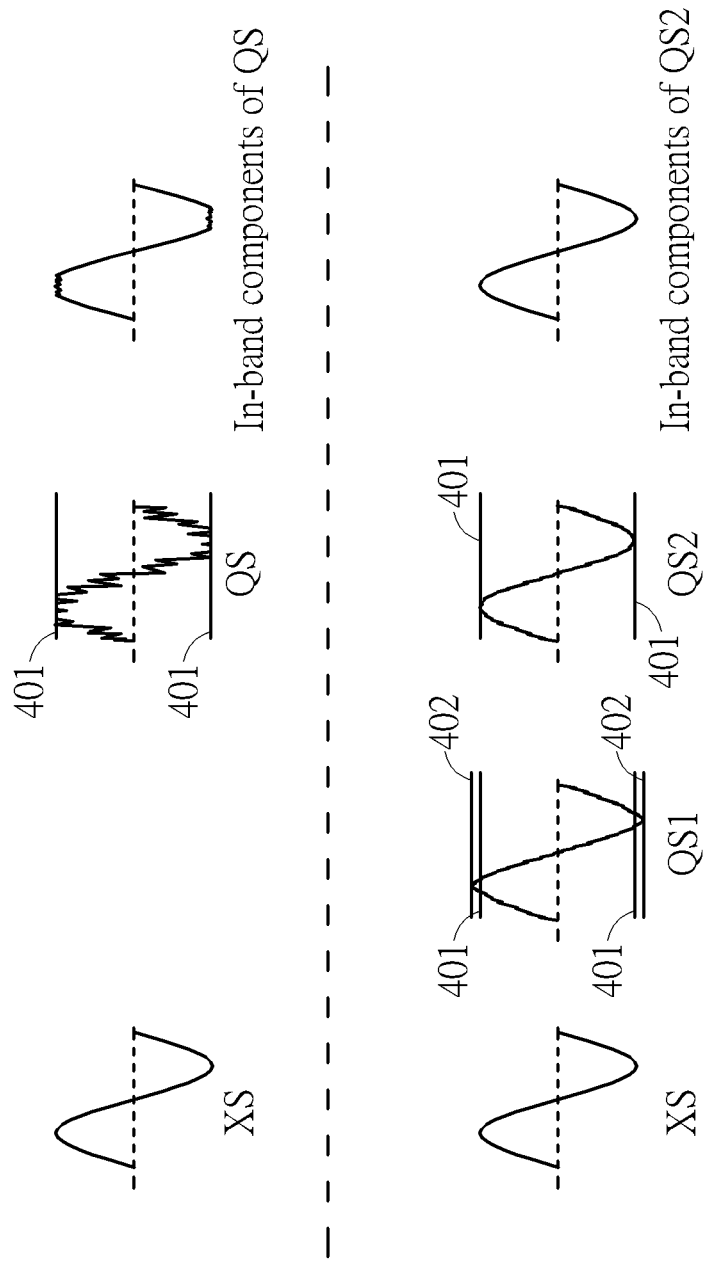
FIG. 4 shows waveforms of the input signal, internal node signal and output signal of the DSM according to the prior art and the series-connected DSM according to an example of the present invention.

FIG. 4 shows waveforms of the input signal, internal node signal and output signal of the DSM 10 according to the prior art and the series-connected DSM 30 according to an example of the present invention. Taking a 20-bit input and a 6-bit resolution output as an example, the input signal XS is a 20-bit digital signal, while the output signal QS of the DSM 10 and the output signal QS2 of the series-connected DSM 30 are both 6-bit digital signals. Please refer to the top of FIG. 4. For the DSM 10, when the input signal XS is large, the output signal QS exceeds a full scale 401 (i.e., the original full scale) of the quantizer QT, which leads to a large clipping error. Therefore, in-band components of the output signal QS suffer from a severe distortion source and is different from the input signal XS. Please refer to the bottom of FIG. 4. As for the series-connected DSM 30, when the input signal XS is large, the first quantizer $Q_{EX}$ provides a full scale 402 (i.e., the extended full scale) with additional quantization levels to avoid clipping error on the first quantized signal QS1. In addition, the clipping error is then processed by the second DSM 310 (e.g., the clipping-error shaping DSM), which maintains the output signal (i.e., the second quantized signal QS2) nearly same as the input signal XS.

Figure 5:
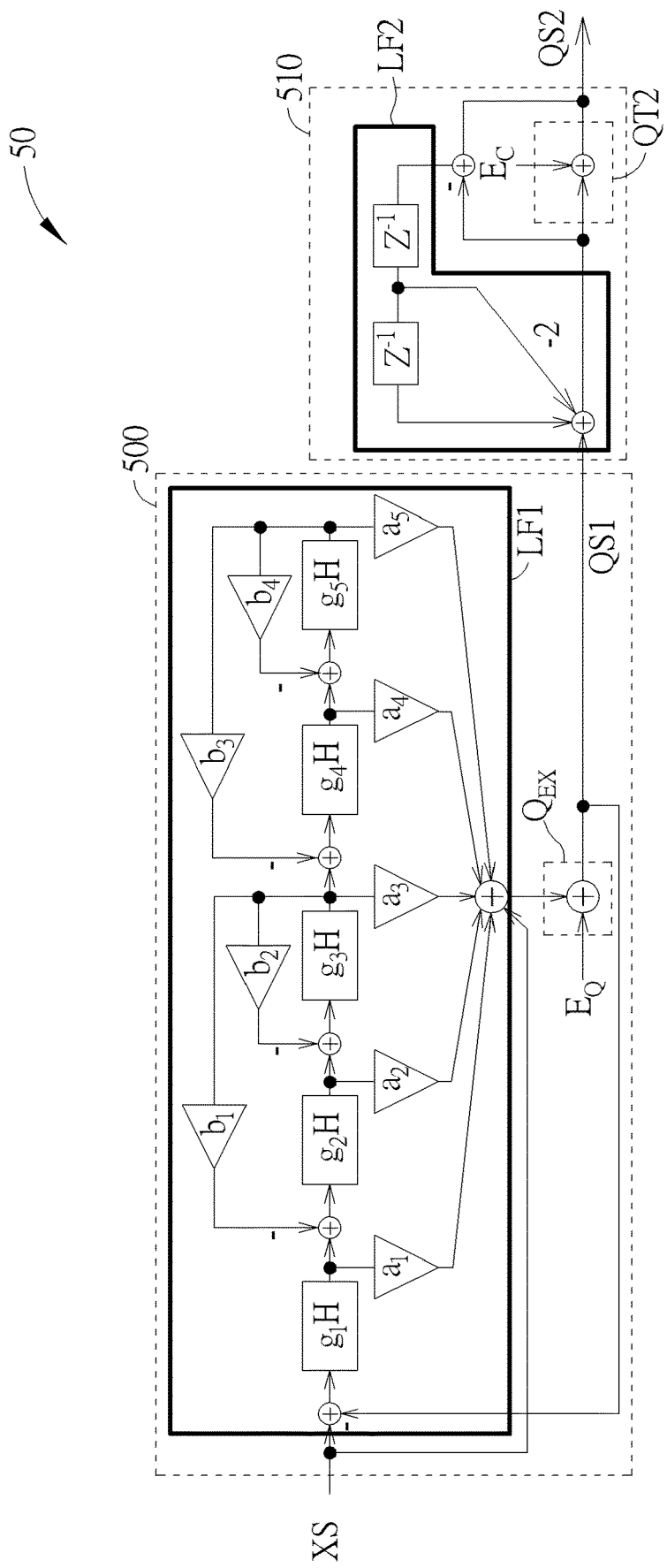
FIG. 5 is a schematic diagram of a series-connected DSM in z-domain according to an example of the present invention.

FIG. 5 is a schematic diagram of a series-connected DSM 50 in z-domain according to an example of the present invention. The series-connected DSM 50 includes a first DSM 500 and a second DSM 510. The first DSM 500 may be the first DSM 300, and includes a first loop filter LF1 and a first quantizer $Q_{EX}$. The first loop filter LF1 may be a fifth-order DSM. The loop filter LF1 includes a plurality of transfer functions $g_1H$, $g_2H$, $g_3H$, $g_4H$ and $g_5H$ and a plurality of DSM coefficients $a_1$, $a_2$, $a_3$, $a_4$, $a_5$, $b_1$, $b_2$, $b_3$ and $b_4$, for receiving the input signal XS. The transfer function H is equal to $z^{-1}/(1-z^{-1})$. The first quantizer $Q_{EX}$ introduces a quantization error $E_Q$ and feeds back little clipping error $E_C$ to the first loop filter LF1. The first quantizer $Q_{EX}$ generates a quantized signal QS1 and transmits the quantized signal QS1 to the second DSM 510. The second DSM 510 may be the second DSM 310, and includes a second loop filter LF2 and a second quantizer QT2. The second loop filter LF2 may be a second-order DSM. The loop filter LF2 includes a plurality of transfer functions $z^{-1}$ and DSM coefficients 1 and −2 which are both integers. The second quantizer QT2 introduces the clipping error $E_C$. The second quantizer QT2 generates the output signal QS2 of the series-connected DSM 50. The plurality of transfer functions $g_1H$, $g_2H$, $g_3H$, $g_4H$, $g_5H$ and $z^{-1}$ may be implemented as at least one integrator or at least one resonator, and may be implemented as at least one discrete-time circuit or at least one continuous-time circuit. All coefficients included in the second DSM 510 may be integers. The arithmetic results at each internal node may fall in a range of {−1, −31/32, −30/32, . . . , 0, . . . , +30/32, +31/32, +1}. That is, little quantization error is introduced in the second DSM 310. Thus, a SNDR of the series-connected DSM 50 is not affected by the second DSM 510 while an amplitude of the input signal XS is small.

Figure 6:
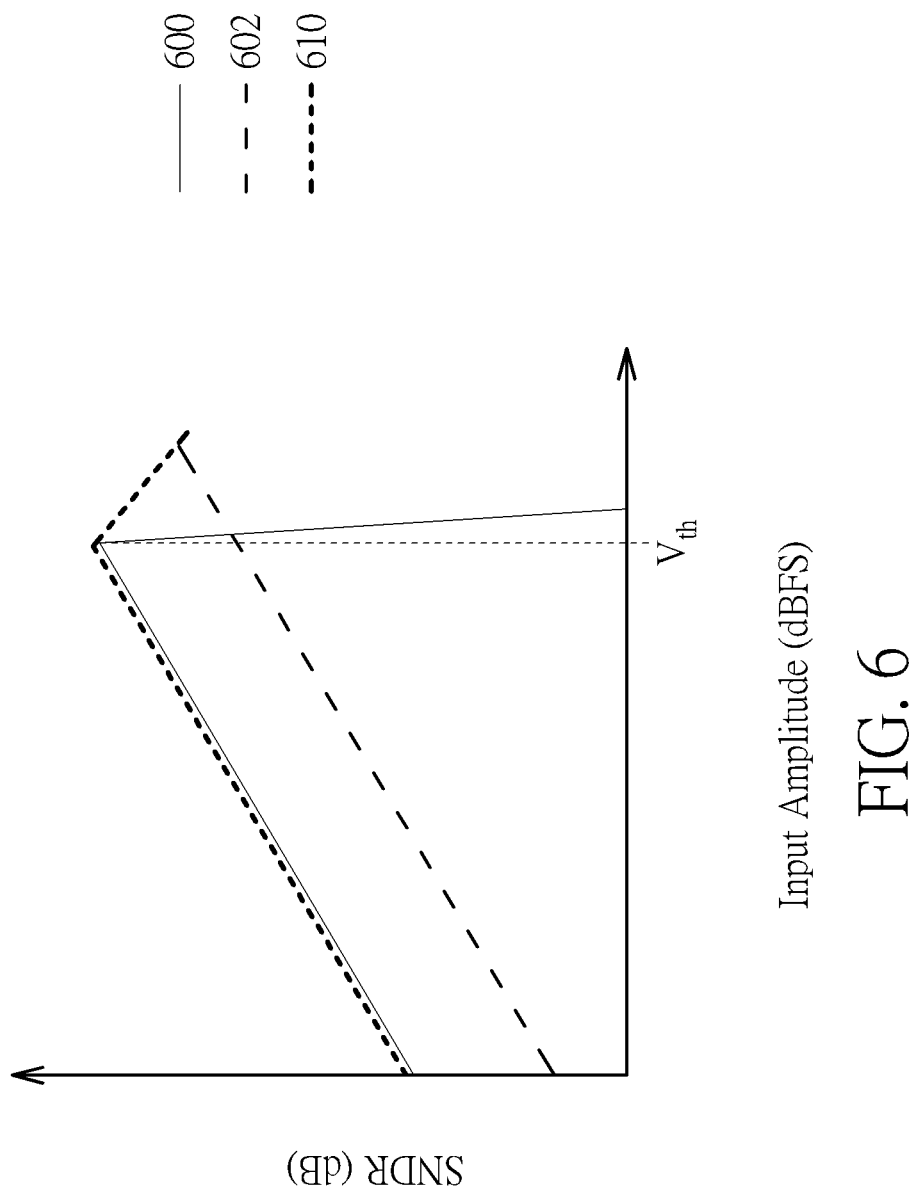
FIG. 6 is a comparison diagram of expected SNDRs between the DSM according to the prior art and the series-connected DSM according to an example of the present invention.

FIG. 6 is a comparison diagram of expected SNDRs between the DSM 10 according to the prior art and the series-connected DSM 30 according to an example of the present invention. In FIG. 6, the x-axis is an input amplitude of an input signal. The unit of the input amplitude is decibel relative to full-scale (dBFS). The y-axis is a SNDR. The unit of the SNDR is decibel (dB). A curve 600 is a schematic result of the DSM 10 with the aggressive noise-shaping ability. As shown in the curve 600 in FIG. 6, the SNDR drops severely when the input amplitude becomes larger than a threshold $V_{th}$. A curve 602 is a schematic result of the DSM 10 for extending the input range. As shown in the curve 602 in FIG. 6, although the SNDR does not drop as the input amplitude becomes larger than the threshold Vth, the SNDR is lower than that of the DSM 10 with the aggressive noise-shaping ability. A curve 610 is a schematic result of the series-connected DSM 30 according to an example of the present invention. As shown in the curve 610 in FIG. 6, for the input amplitude smaller than the threshold Vth, the SNDR of the series-connected DSM 30 is similar to that of the DSM 10 with the aggressive noise-shaping ability, and is higher than that of the DSM 10 for extending the input range. As the input amplitude becomes larger than the threshold Vth, the SNDR of the series-connected DSM 30 drops slightly since only little clipping error is fed back to the loop filter. Thus, the performance of the series-connected DSM 30 is better than the DSM 10 since the series-connected DSM 30 maintains the high SNDR and simultaneously extends the input range.

Figure 7:
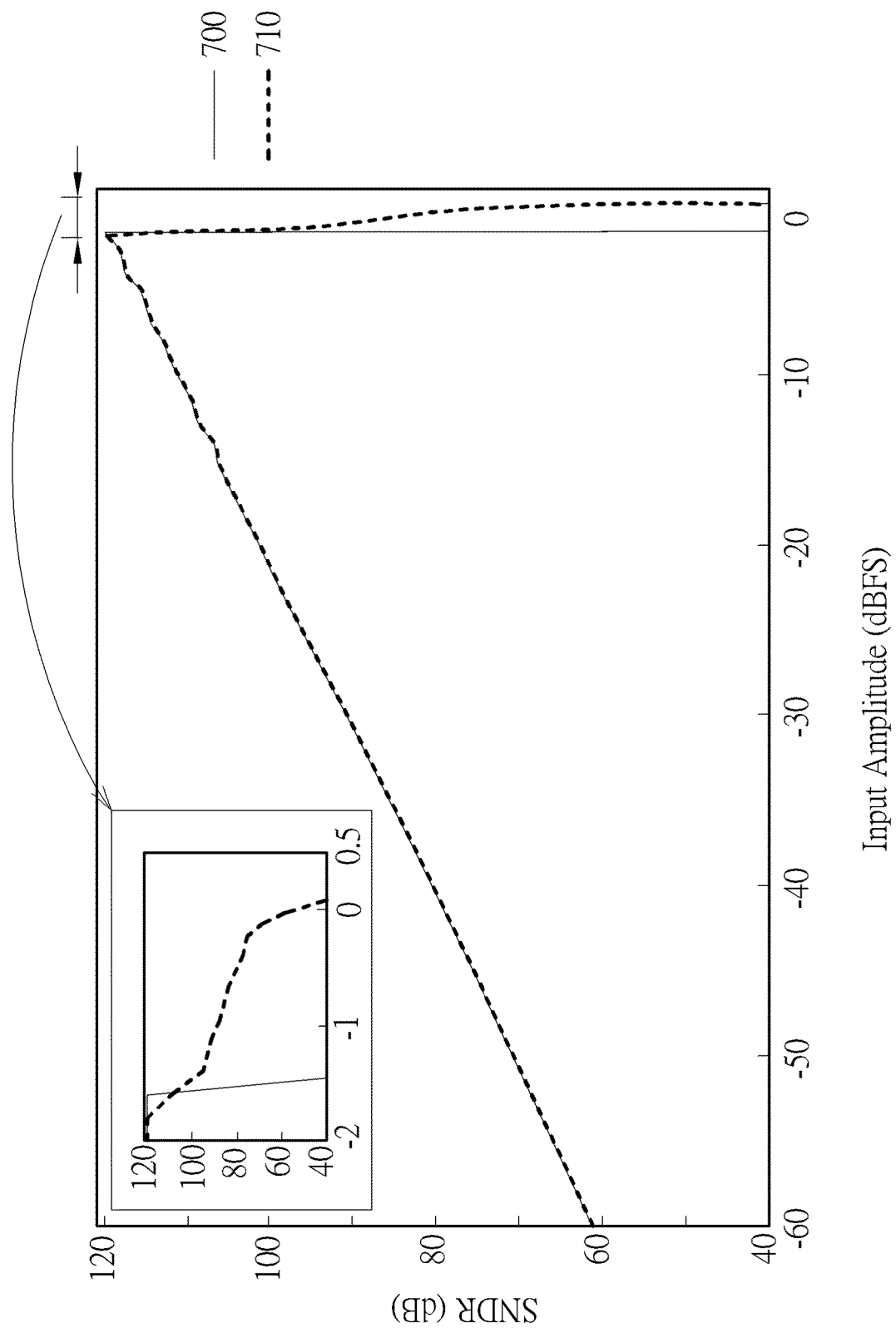
FIG. 7 is a comparison diagram of simulated SNDRs between the DSM according to the prior art and the series-connected DSM according to an example of the present invention.

FIG. 7 is a comparison diagram of simulated SNDRs between the DSM 10 according to the prior art and the series-connected DSM 30 according to an example of the present invention. In FIG. 7, the x-axis is an input amplitude of an input signal. The unit of the input amplitude is dBFS. The y-axis is a SNDR. The unit of the SNDR is dB. A curve 700 is a simulation result of the DSM 10, and a curve 710 is a simulation result of the series-connected DSM 30. As shown in FIG. 7, for the SNDR of 40 dB, the input amplitudes of the DSM 10 and the series-connected DSM 30 are −1.4 dBFS and 0.2 dBFS, respectively. That is, compared with the DSM 10, the series-connected DSM 30 extends the maximum input amplitude with 40 dB SNDR from −1.4 dBFS to 0.2 dBFS, and maintains the SNDR up to 60 dB for a 0-dBFS input amplitude.

Figure 8:
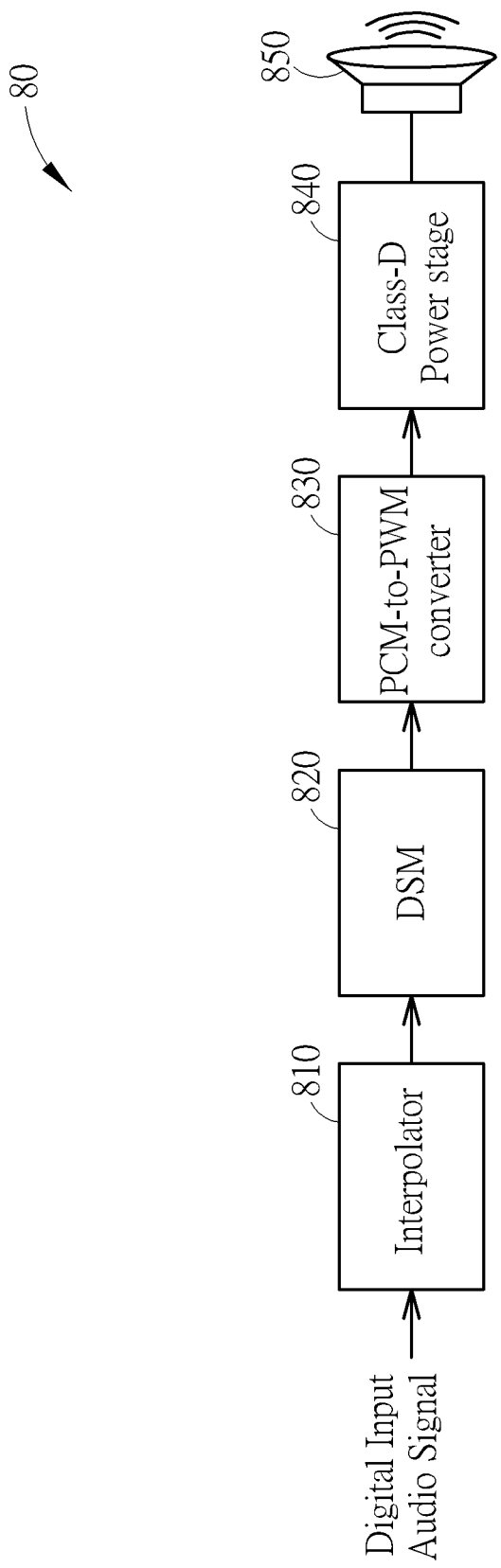
FIG. 8 is a schematic diagram of a digital-input class-D audio amplifier.

FIG. 8 is a schematic diagram of a digital-input class-D audio amplifier 80. The digital input audio signal is oversampled and processed by an interpolator 810. Then, the oversampled signal is processed by a DSM 820 to perform a high resolution with a pulse-code modulation (PCM) signal, and is converted into a pulse-width modulation (PWM) signal by a PCM-to-PWM converter 830. The PWM signal is used to drive a class-D power stage 840 (e.g., an H-bridge power stage) of the digital-input class-D audio amplifier 80. When the digital audio signal is large, significant clipping error is induced in a conventional DSM (e.g., the DSM 10), leading to a severe degradation of total harmonic distortion plus noise (THD+N) when delivering high audio power levels to a speaker 850. Hence, the series-connected DSM 30 may be used in Class-D audio amplifier to prevent clipping error from limiting the input range of the amplifier.

Figure 9:
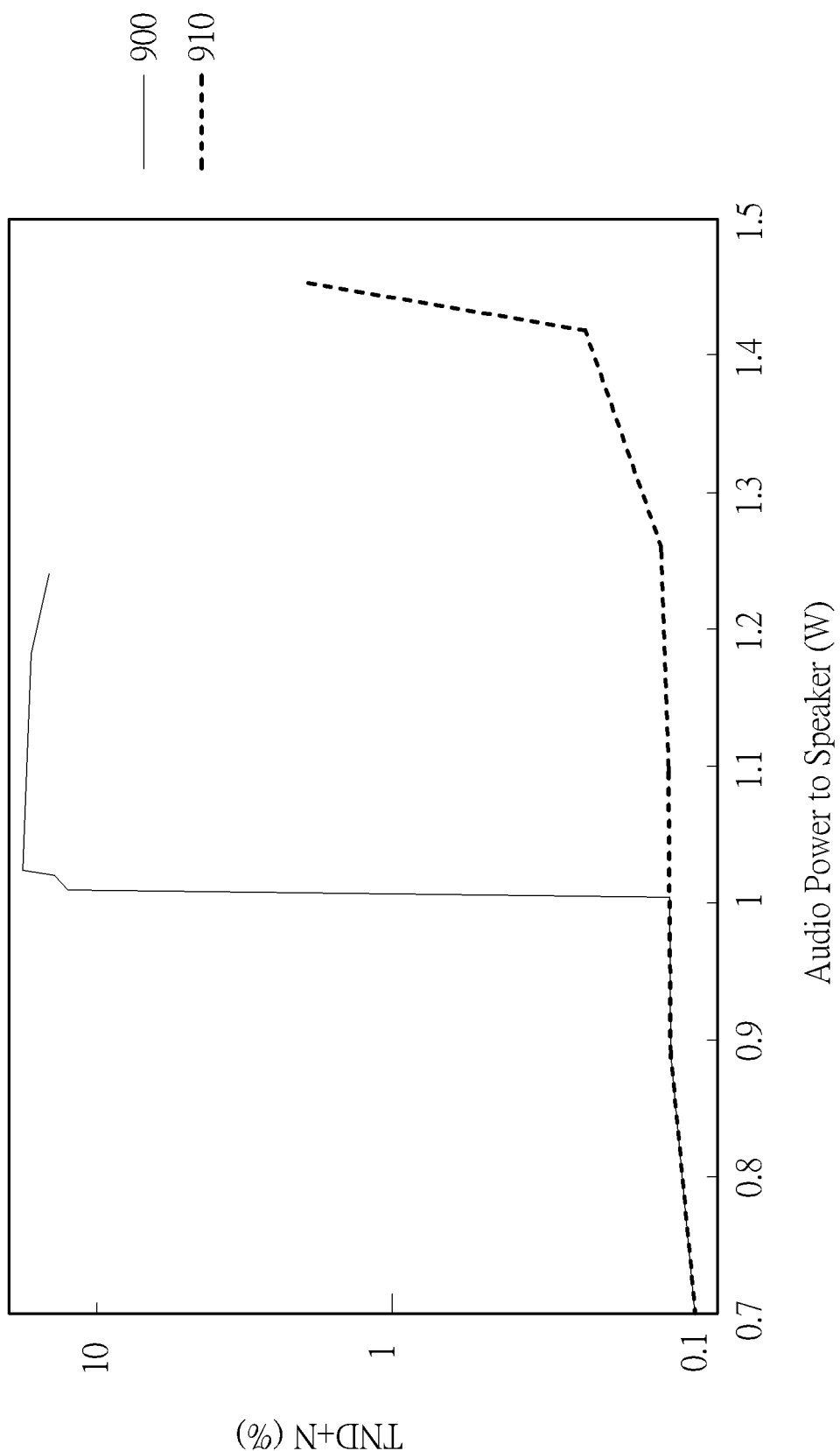
FIG. 9 is a comparison diagram of performances between the DSM applied to a class-D audio amplifier according to the prior art and the series-connected DSM applied to a class-D audio amplifier according to an example of the present invention.

FIG. 9 is a comparison diagram of performances between the DSM 10 applied to a digital-input class-D audio amplifier 80 according to the prior art and the series-connected DSM 30 applied to a digital-input class-D audio amplifier 80 according to an example of the present invention. In FIG. 9, the x-axis is an audio power to the speaker 850 of the digital-input class-D audio amplifier 80. The unit of the audio power is watt (W). The y-axis is THD+N. The unit of the THD+N is percent (%). A curve 900 is a simulation result of the DSM 10 applied to the digital-input class-D audio amplifier 80, and a curve 910 is a simulation result of the series-connected DSM 30 applied to the digital-input class-D audio amplifier 80. As shown in FIG. 9, as the THD+N reaches 1%, the output power of the digital-input class-D amplifier 80 applying the DSM 10 and the series-connected DSM 30 are 1 W and 1.4 W, respectively. That is, compared with the DSM 10, the series-connected DSM 30 extends 40% of output power with the THD+N of 1%, and audio quality under conditions of low audio power is not sacrificed.

To sum up, the present invention provides a series-connected DSM. The series-connected DSM achieves a large input range and a high SNDR simultaneously. Thus, the problem in the art is solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A series-connected delta-sigma modulator (DSM), comprising:
   a first DSM, configured to receive an input signal, comprising:
      a first loop filter, configured to generate a first processed signal; and
      a first quantizer, coupled to the first loop filter, configured to generate a first quantized signal according to the first processed signal, and to feed back the first quantized signal to the first loop filter;
      wherein the first loop filter generates the first processed signal according to the input signal and the first quantized signal fed back to the first loop filter, and the first quantized signal comprises a clipping error smaller than a first predetermined value; and
   a second DSM, coupled to the first DSM, configured to receive the first quantized signal from the first DSM, comprising:
      a second loop filter, configured to generate a second processed signal; and
      a second quantizer, coupled to the second loop filter, configured to generate a second quantized signal according to the second processed signal, and to feedback the second quantized signal to the second loop filter;
      wherein the second loop filter generates the second processed signal according to the first quantized signal and the second quantized signal fed back to the second loop filter, and the second quantized signal comprises a quantization error smaller than a second predetermined value.

2. The series-connected DSM of claim 1, wherein the first loop filter comprises at least one first stage for receiving the input signal and the first quantized signal.

3. The series-connected DSM of claim 1, wherein the second loop filter comprises at least one second stage for receiving the first quantized signal and the second quantized signal.

4. The series-connected DSM of claim 1, wherein the first loop filter and the second loop filter comprise at least one integrator or at least one resonator.

5. The series-connected DSM of claim 1, wherein the first loop filter and the second loop filter comprise at least one discrete-time circuit or at least one continuous-time circuit.

6. The series-connected DSM of claim 1, wherein the first quantizer comprises a first plurality of quantization levels, and the second quantizer comprises a second plurality of quantization levels.

7. The series-connected DSM of claim 6, wherein a number of the first plurality of quantization levels is larger than a number of the second plurality of quantization levels.

8. The series-connected DSM of claim 1, wherein the first quantizer and the second quantizer perform a plurality of sampling operations at a same frequency.

9. The series-connected DSM of claim 1, wherein the first quantizer and the second quantizer perform a plurality of sampling operations at different frequencies.

* * * * *